United States Patent [19]

Beckmann

[11] 4,287,600
[45] Sep. 1, 1981

[54] FREQUENCY SYNTHESIZER WITH ROM CONTROLLED DIVIDER AND DISPLAY

[75] Inventor: Robert M. Beckmann, Hanover Park, Ill.

[73] Assignee: Motorola, Inc., Schaumburg, Ill.

[21] Appl. No.: 128,708

[22] Filed: Mar. 10, 1980

Related U.S. Application Data

[63] Continuation of Ser. No. 883,109, Mar. 3, 1978, abandoned.

[51] Int. Cl.³ .............................................. H04B 1/06
[52] U.S. Cl. ...................................... 455/158; 334/87
[58] Field of Search ............... 455/158, 154, 155, 156, 455/157, 159, 179, 183, 185, 186; 334/86, 87; 358/191.1, 192.1

[56] References Cited

U.S. PATENT DOCUMENTS

| | | |
|---|---|---|
| 3,835,424 | 9/1974 | Marik . |
| 3,845,394 | 10/1974 | Hamada . |
| 3,846,707 | 11/1974 | Sakamoto . |
| 3,968,440 | 7/1976 | Ehni . |
| 3,973,205 | 8/1976 | Tanaka . |
| 4,024,477 | 5/1977 | Yamaguchi . |
| 4,114,103 | 9/1978 | Pflasterer . |
| 4,117,407 | 9/1978 | Kusakabe . |

OTHER PUBLICATIONS

National Semiconductor DS8900 Frequency Synthesizer, Preliminary Specifications, Feb. 1977.

Primary Examiner—Jin F. Ng
Assistant Examiner—Tommy P. Chin
Attorney, Agent, or Firm—Phillip H. Melamed; James W. Gillman

[57] ABSTRACT

A frequency synthesizer is disclosed in which a single read only memory (ROM) is utilized to directly control programmable frequency dividers in a phase locked loop while also directly controlling the excitation of seven segment visual digital display modules. During the tuning of the frequency synthesizer, an enable circuit disables the programmable dividers while altering the input signals to the read only memory such that direct drive signals are produced by the output of the read only memory which alternately excite two separate seven segment displays modules. After the tuning operation is completed, the enable circuit alters the input signals to the read only memory, simultaneously enables the programmable dividers, and effectively disables the digital display modules such that they hold their previous visual displays.

19 Claims, 1 Drawing Figure

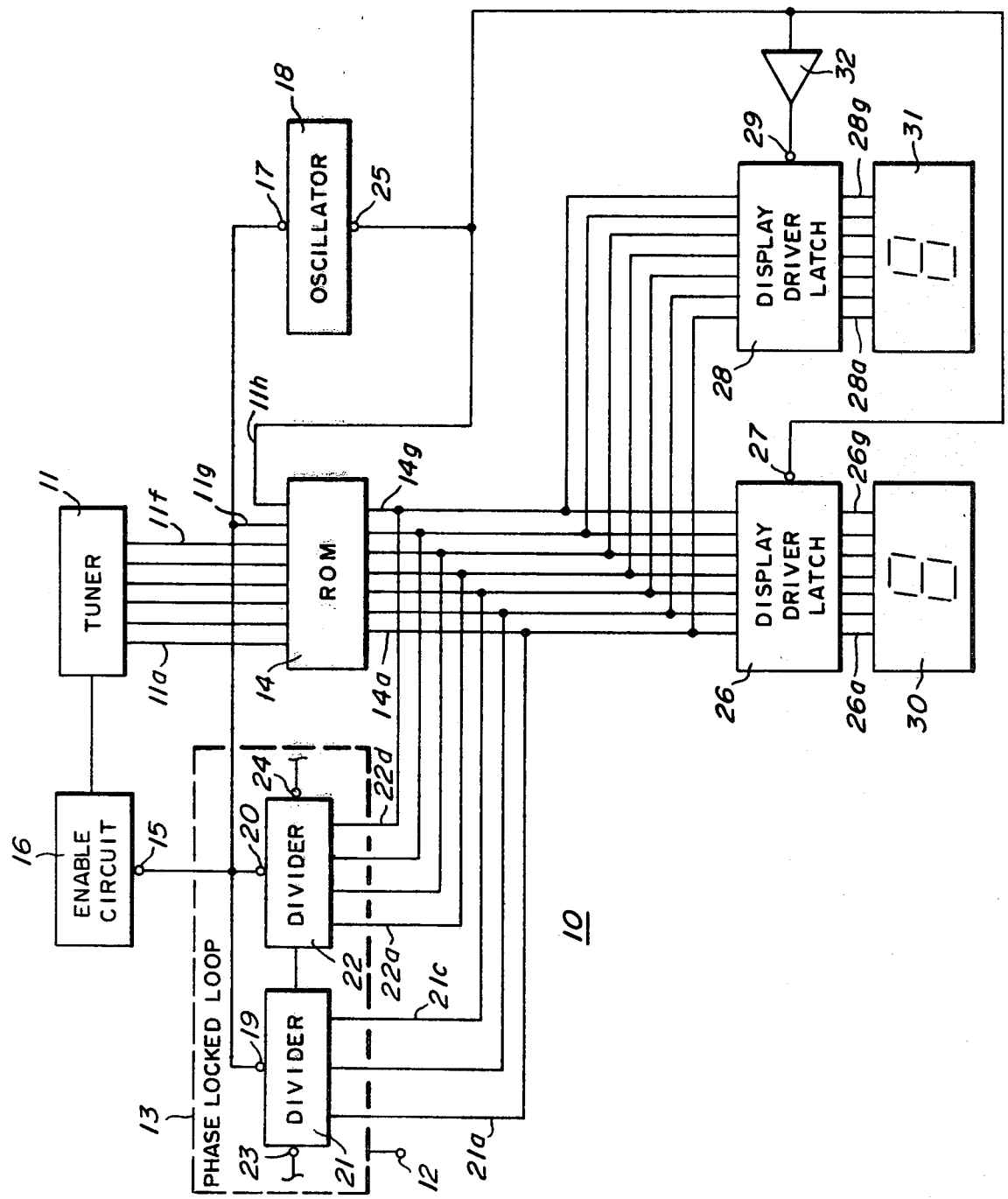

FREQUENCY SYNTHESIZER WITH ROM CONTROLLED DIVIDER AND DISPLAY

This is a continuation of application Ser. No. 883,109 filed Mar. 3, 1978, now abandoned.

CROSS REFERENCE TO RELATED APPLICATIONS

The present invention is related to an invention described in a copending U.S. patent application entitled "Multi-Channel Communication Device with Manual and Automatic Scanning Electronic Channel Selection" by Goncharoff and Puntil, Ser. No. 711,036, filed Aug. 2, 1976, now abandoned.

BACKGROUND OF THE INVENTION

The invention generally relates to digital control apparatus and more particularly to the use of such apparatus in frequency synthesizers.

Prior art frequency synthesizer circuits utilize a read only memory (ROM) which receives a plurality of digital coded input signals and produces a specific plurality of digital coded output signals in response to each different received plurality of coded input signals. The ROM circuits function as table look up devices in which a different specific plurality of output signals is produced for each one of a different plurality of coded input signals applied to the read only memory. Such devices are well known to those skilled in the art and have been used in frequency synthesizer applications.

Generally, the output of the read only memory in a frequency synthesizer consists of a group of binary coded decimal (BCD) signals which are simultaneously coupled to programmable dividers in a phase locked loop while also being coupled to BCD decoders which create drive signals for seven segment visual digital display modules. These seven segment digital display modules are well known to those skilled in the art and are generally driven (excited) by seven individual excitation signals. The BCD decoder drivers for these displays are also well known in the art and perform the function of receiving the BCD output signals from the read only memory and converting these signals into the seven required drive signals needed to drive the seven segment display modules. Thus prior art frequency synthesizers required the use of BCD to seven segment excitation signal decoders for each digital display module. This results in increasing the cost and complexity of prior art frequency synthesizers since logic gates must be provided to perform the necessary decoding function. This is because the programmable dividers commonly available are constructed so as to be driven by one type of digital coded signals (BCD) whereas the seven segment display modules are to be driven by another type of digital coded signals.

SUMMARY OF THE INVENTION

An object of the present invention is to provide an improved and simplified digital control apparatus which overcomes the aforementioned deficiencies.

Another object of the present invention is to provide improved digital control apparatus which controls two differently coded apparatus by digital signals without the use of a digital signal decoder apparatus preceding one of the two controlled apparatus.

A more particular object of the invention is to provide an inproved digital control apparatus in which a read only memory means is used to control a programmable divider means and a digital display means.

A further object of the present invention is to provide an improved frequency synthesizer in which a read only memory means is utilized to control both the programmable divider in a phase locked loop and a visual display means, wherein digital signal decoders are not required to convert the output signals of the read only memory means into signals which are usable by the programmable divider or the visual display means.

In one embodiment of the present invention an improved digital control apparatus is provided. The apparatus comprises: memory means for receiving a plurality of digital coded input signals and producing different corresponding pluralities of digital coded output signals in response to each different received plurality of coded input signals; first means coupled to said memory means for receiving said plurality of coded output signals and producing, when enabled, different corresponding first predetermined conditions in response to each different received plurality of coded output signals; second means coupled to said memory means for receiving said plurality of coded output signals and producing, when enabled, different corresponding second predetermined conditions in response to each received different plurality of coded output signals; and control means coupled to said memory means and said first and second means for alternately enabling each of said first and second means while the other is disabled, while also correspondingly alternately changing at least one of said plurality of coded input signals to said memory means, whereby said control means allows the memory means to alternately produce different output drive control signals to control both of said first and second means.

Preferably, the memory means comprises a ROM means and the first means comprises a programmable divider means in which a predetermined frequency division is produced in response to the coded output signals received by this means. Also, the second means preferably comprises a display means for producing a predetermined display in response to the output control signals received by this means. The present invention also provides for utilizing the above described components in a frequency synthesizer in which a manual turning means is utilized for adjustably producing some of the plurality of coded input signals received by the read only memory means and wherein the programmable divider means is part of a phase locked loop which produces an output signal having a frequency determined by the frequency division produced by the divider means.

Basically, the present invention comprises utilizing a read only memory means such that in one mode of operation it produces coded output signals for controlling one type of digital apparatus, such as the programmable divider of a phase locked loop, while in another mode of operation the read only memory means produces another group of output signals which directly control another digital apparatus such as a visual display means which produces an indication of the output frequency of the phase locked loop. The control of two different digital apparatus by a single read only memory is accomplished by selectively altering the input signals to the read only memory such that appropriate output signals are produced by the read only memory only when the digital apparatus that is to be controlled by these output signals has been enabled. When the controlled digital apparatus are disabled they maintain the state they were in when they were last enabled.

BRIEF DESCRIPTION OF THE DRAWING

For a more complete understanding of the invention reference should be made to the drawing which is a block schematic diagram of a frequency synthesizer.

DESCRIPTION OF THE PREFERRED EMBODIMENT

Referring to the drawing, a frequency synthesizer 10 is illustrated comprising a manually adjustable tuning apparatus 11 for selectively producing a plurality of six coded digital signals on a plurality of six different conductors 11a through 11f, respectively, which determine the output frequency of the synthesizer 10 produced at an output terminal 12 of a phase locked loop 13 (shown dashed). The six conductors 11a through 11f couple the tuner 11 to a read only memory (ROM) 14 wherein the conductors provide a plurality of digital coded input signals for the ROM 14 which are created by the tuner 11. The ROM 14 also receives an input signal on a conductor 11g that is coupled to an output terminal 15 of an enable circuit 16 that is coupled to the tuner 11. The output terminal 15 is also connected to a control terminal 17 of a square wave oscillator 18 and control terminals 19 and 20 of programmable frequency dividers 21 and 22, respectively.

The dividers 21 and 22 are serially connected such that any signal received at an input terminal 23 of the divider 21 will be subject to the frequency division performed by both of the dividers 21 and 22 and result in a frequency divided output signal being produced at an output terminal 24 of the divider 22. The dividers 21 and 22 are part of the phase locked loop 13 which is only partially shown in the drawing. The phase locked loop 13 is contemplated as comprising a voltage controlled oscillator, a low pass filter, a phase comparator which receives the output of the voltage controlled oscillator and compares it to the output of a reference oscillator and the series connected programmable dividers 21 and 22. These components are all well known and are contemplated as being connected in a standard phase locked loop configuration which is well known to those skilled in the art. The output frequency of the phase locked loop is produced at the output terminal 12.

The frequency division accomplished by the dividers 21 and 22 is determined by digital control signals received by these dividers on conductors 21a through 21c for divider 21 and 22a through 22d for divider 22. The control terminals 19 and 20 control the dividers 21 and 22 such that whenever a high logic signal is present at these terminals the dividers can response to the control signals present on the conductors 21a–21c and 22a–22d. When a low logic signal is provided at the terminals 19 and 20, the dividers 21 and 22 will produce the frequency division corresponding to the control signals last received when the terminals 19 and 20 were at a high logic state. All of the components comprising the phase locked loop 13, including the programmable frequency dividers 21 and 22, are well known to those skilled in the art and are either readily available or can be readily constructed.

The read only memory 14 has a plurality of output conductors 14a through 14g and the read only memory produces different corresponding pluralities of digital coded output signals on these conductors in response to each different received plurality of coded input signals present on the conductors 11a through 11g and the input signal present on a conductor 11h that is directly connected as an input to ROM 14 and is also connected to an output terminal 25 of the square wave oscillator 18. In essence, the read only memory 14 performs a table look up function in that for each plurality of different coded input signals received by the ROM 14 on the conductors 11a through 11h, the ROM 14 produces different coded output signals on the conductors 14a through 14g. Thus the ROM 14 merely represents a 9×8 table look up device. ROMs used as such devices are well known to those skilled in the art.

The conductors 14a through 14g are directly connected as logic inputs both to a display driver latch 26 having a control terminal 27 and to a display driver latch 28 having a control terminal 29. The latches 26 and 28 each supply seven excitation signals to visual seven segment digital display modules 30 and 31 on conductors 26a–26g and 28a–28g, respectively. The latches 26 and 28 basically comprise register circuitry such that when positive transitions are present at the terminals 27 or 29 a plurality of excitation signals will be created on conductors 26a through 26g or 28a through 28g, respectively, which are identical to the signals on conductors 14a–14g. No decoding circuitry is present in the driver latches 26 and 28. Thus when a positive transition occurs at the terminal 27, for example, display module excitation signals are created or the conductors 26a through 26g such that these excitation signals correspond in logic directly to the signals present on the conductors 14a through 14g. Thus the display driver latches 26 merely represent gatable registers that are capable of receiving a plurality of logic signals and producing corresponding identical logic drive signals when enabled. When the latches 26 and 28 are not enabled, the latches merely produce the same excitation signals that they produced the last time that these latches were enabled and they do not respond to the signals currently on conductors 14a–14g. Thus the latches store the signals they received when they were last enabled and provide those stored signals as drive signals to the display modules when the latches are disabled. Such gatable latches can be readily implemented by those of skill in the art.

The output terminal 25 of the square wave oscillator 18 is directly connected to the control terminal 27 of the latch 26 and is connected through an inverter 32 to the control terminal 29 of the driver latch 28. When the oscillator 18 is rendered operative by applying a low logic signal to terminal 17, a continuous square wave signal comprising high and low logic states will be produced at the terminal 25 and this will result in alternately enabling the latches 26 and 28 thereby resulting in these latches and their associated digital display modules being alternately controlled by the logic signals present on the conductors 14a through 14g.

The operation of the frequency synthesizer 10 shown in the drawing will now be discussed in detail.

Prior to any adjustment of the manual tuner 11, the tuner produces a predetermined plurality of frequency determining control signals on the conductors 11a through 11f. The enable circuit 16 is coupled to the tuner and produces a high logic signal at the terminal 15 whenever the tuner 11 is not being adjusted. This high logic signal at the terminal 15 results in enabling the dividers 21 and 22 so that they will now directly respond to the output digital signals produced by the ROM 14 on the conductors 14a through 14g. The terminal 15 also provides a high logic signal input to the ROM 14 on the conductor 11g as well as providing a high logic signal to the terminal 17 of the oscillator 18 which disables this oscillator. With the oscillator 18 disabled, a low logic signal is always produced at the terminal 25 to serve as the input to the ROM present on the conductor 11h. The disabling of the oscillator 18 also prevents the production of any positive going transitions and therefore the driver latches 26 and 28 are not activated during this mode of operation. The latches 26 and 28 supply excitation signals to their respective digital display modules representative of the logic signals which they received during the last time that the latches were enabled. Therefore prior to any manual adjustment of the tuner 11 to change frequency, the frequency synthesizer 10 converts the non varying logic signals received on the conductors 11a through 11h into logic signals on the conductors 14a through 14g which in turn control the division created by the frequency dividers 21 and 22 and thereby determine the frequency of the output signal of the phase locked loop produced at the output terminal 12.

Whenever it is desired to change the frequency of the output signal produced at the output terminal 12, the logic signals produced by the tuner 11 on the conductors 11a through 11f will be altered. The enable circuit 16 during this altering of the logic signals on the conductors 11a through 11f will produce a low logic signal at the terminal 15. Preferably, the tuner 11 will comprise a manually controllable scanning tuner apparatus having a counter whose digital output is represented by the control signals present on the conductors 11a through 11f. When a change in tuning frequency is desired, the counter will be incremented until the desired frequency is obtained. The incrementing of the counter is accomplished by gating clock signals into the input of the counter in response to the creation of a scan enable signal. This scan enable signal, in the present embodiment, would directly correspond to the signal produced at the output terminal 15 of the enable circuit 16. The operation and construction of the tuner 11 and the enable circuit 16 can be readily implemented by those skilled in the art and one such suitable implementation is illustrated in a U.S. patent application entitled, "Multi-Channel Communication Device with Manual and Automatic Scanning Electronic Channel Selection", by Goncharoff and Puntil, Ser. No. 711,036, filed Aug. 2, 1976 and assigned to the same assignee as the present invention. That application discloses how a scan enable signal corresponding to the signal produced at the terminal 15 is utilized to gate clock pulses into a counter whose output count is coupled to a read only memory for determining the output frequency of a phase locked loop in a synthesizer. The basic function of the tuner 11 and enable circuit 16 is to produce frequency determining control signals on the conductors 11a through 11f while also indicating if the tuning is being changed by creating the logic signal present at the terminal 15.

As previously mentioned, in response to adjusting the control signals produced on the conductors 11a through 11f on the tuner 11, a low control signal is produced at the terminal 15 which indicates a tuning change. This low control signal exists for at least the duration of the tuning change and results in disabling the dividers 21 and 22 while simultaneously enabling the oscillator 18. In addition, a low logic input signal is also provided to the ROM 14 on the conductor 11g while the square wave oscillator 18 periodically supplies high and low logic signals to the ROM 14 on the conductor 11b during the tuning change. The control signals on the conductors 11g and 11h during this change of tuning mode effectively select different table look ups for the read only memory 14 such that now seven segment excitation logic signals for each of the modules 30 and 31 are produced on the conductors 14a through 14g. Previously, the ROM 14 produced preferably binary coded decimal logic signals on the lines 14a through 14g which thereby controlled the division produced by the dividers 21 and 22. However, now the dividers 21 and 22 are disabled and therefore are not effected by the logic states present on the conductors 14a through 14g.

During the change of tuning mode the display driver latches 26 and 28 are alternately momentarily enabled during the existence of positive transitions created by the square wave oscillator 18. During the enabling of each of the latches 26 and 28 different seven segment excitation signals are alternately supplied on the lines 14a through 14g since the square wave oscillator 18 will also alternately produce different logic input signals to the ROM 14 on the line 11h. Thus essentially during a change in tuning mode, the dividers 21 and 22 of the phase locked loop 13 are disabled such that they are not effected by the logic outputs of the ROM 14. The oscillator 18 is activated and results in periodically altering the input to the ROM 14 received on the conductor 11h. The oscillator 18 also results in periodically alternately enabling the driver latches 26 and 28 such that effectively scan of the display modules 30 and 31 is alternately controlled by the output logic signals of the ROM 14 during the change in tuning.

Thus the present invention has provided apparatus in which a single read only memory 14 has been utilized to produce binary coded decimal logic signals to control the division or frequency dividers in a phase locked loop while also controlling display means comprising the driver latches 26 and 28 and the display modules 30 and 31. The present invention has eliminated the need for requiring decoder logic to decode the output logic signals of the read only memory and thereby convert these signals into seven segment excitation logic signals for the display modules. This has been accomplished by disabling the frequency dividers during a change of tuning mode of operation while altering the input logic signals to the read only memory device to essentially create a different table look up logic function for the read only memory during the change of tuning mode of operation.

It is contemplated that the frequency synthesizer 10 will first have its manually adjustable tuner apparatus, comprising the tuner 11 and enable circuit 16, adjusted so as to produce the desired visual display on the display modules 30 and 31. This will correspond to a predetermined plurality of logic signals on the conductors 11a through 11f. Once the tuning adjustment is completed, then the enable circuit 16 will disable the oscillator 18 and enable the dividers 19 and 20 as well as changing the input to the ROM 14 on the conductor 11g. After the adjustment of the tuning mode, the phase locked loop 13 will produce an output signal at the terminal 12 having the desired frequency which corresponds to the visual display indicated by the display modules 30 and 31. This is because the logic signals present on the conductors 11a through 11f will not have changed after the tuning apparatus has ceased to be adjusted and the ROM 14 will now provide appropriate BCD output signals on the conductors 14a–14g.

While I have shown and described specific embodiments of this invention, further modifications and improvements will occur to those skilled in the art. Such modifications could include, for example, the provision of a delay between the output terminal 25 of the square wave oscillator 18 and the control terminals 27 and 29 of the driver latches. Such a delay would merely insure that a stable logic state had been created on the conductor 11h as an input to the ROM 14 before any positive going logic transition was created at the terminals 27 and 29 to enable their respective driver latches 26 and 28. All such modifications which retain the basic underlying principles disclosed and claimed herein are within the scope of this invention.

I claim:

1. Digital control apparatus comprising: memory means for receiving a plurality of digital coded input signals and producing different corresponding pluralities of digital coded output signals in response to each different received plurality of coded input signals;

programmable divider means coupled to said memory means for receiving said plurality of coded output signals and producing, when enabled, different predetermined divisions in response to each different received plurality of coded output signals, wherein said programmable divider means, when disabled, produces the predetermined division corresponding to the coded output signals received by said divider means when said divider means was last enabled;

display means coupled to said memory means for receiving said plurality of coded output signals and producing, when enabled, different corresponding predetermined displays in response to each different received plurality of coded output signals, wherein said display means comprises display modules controllable latch means for receiving signals when enabled and storing those received signals when disabled while providing those stored signals as drive signals to said display modules; and control means coupled to said memory means, said divider means, and said display means for alternately enabling each of said divider and display means while the other means is disabled while also correspondingly alternately changing at least one of said plurality of coded input signals to said memory means, wherein said control means utilizes the memory means to alternately produce different output control signals to sequentially control both said divider means and said display means to produce a display related to the division implemented by said divider means, said control means utilizing said memory means to provide one of said plurality of coded output signals to an enabled one of said divider and display means and then to provide a different related one of said plurality of coded output signals to an enable other one of said divider and display means.

2. Digital control apparatus according to claim 1 wherein said display means comprises at least one seven segment visual display module driven by said controllable latch means.

3. Digital control apparatus according to claim 2 wherein said pluralities of coded output signals supplied by said memory means to said programmable divider means, when said programmable divider means is enabled, are binary coded decimal signals, and wherein said pluralities of coded output signals supplied by said memory means to said display means, when said display means is enabled, are direct drive seven segment excitation signals for said seven segment display module.

4. Digital control apparatus according to claim 1 wherein said display means comprises at least two controllable latch means controlling separate visual display modules and wherein said control means includes control circuitry for alternately enabling each of said controllable latch means to enable said latch to respond to received digital control signals while the other controllable latch means is disabled and prevented from responding to those control signals, and wherein the same digital control signals are continuously simultaneously applied to both of said controllable latch means.

5. Digital control apparatus according to claim 4 wherein said control circuitry includes an oscillator means for alternately enabling said controllable latch means.

6. Digital control apparatus according to claim 1 wherein said control means disables said programmable divider means during changing the input signals received by said memory means.

7. A frequency synthesizer and control apparatus comprising:

memory means for receiving a plurality of digital coded input signals and producing different corresponding pluralities of digital coded output signals in response to each different received plurality of coded input signals;

programmable divider means, included in a phase locked loop means and coupled to said memory means, for receiving said plurality of coded output signals and producing, when enabled, different predetermined frequency divisions in response to each different received plurality of coded output signals, wherein said programmable divider means, when disabled, produces the predetermined division corresponding to the coded output signals received by said programmable divider means when said programmable divider means was last enabled;

said phase locked loop means producing an output signal having a frequency determined by the frequency division of said programmable divider means;

display means coupled to said memory means for receiving said plurality of output signals and producing, when enabled, different corresponding predetermined displays in response to each different received plurality of coded output signals, wherein said display means comprises controllable latch means for receiving signals when enabled and storing those received signals when disabled and wherein said display means comprises at least one visual display module driven by said stored signals of said controllable latch means;

manual tuning means coupled to said memory means for adjustably producing some of said plurality of coded input signals to said memory means; and control means coupled to said memory means, said manual tuning means, said display means and said programmable divider means for alternately enabling each of said programmable divider means and said display means while the other means is disabled while also correspondingly alternately changing at least one of said plurality of coded input signals to said memory means during the adjusting of said manual tuning means, wherein said control means utilizes the memory means to alternately produce different output control signals to sequentially control both said display means and said programmable divider means to produce a display related to the frequency division implemented by said programmable divider means and thereby eliminate the need for having decoder circuitry preceding said display and programmable divider means, said control means utilizing said memory means to provide one of said plurality of coded output signals to an enabled one of said divider programmable divider means and display means and then to provide a different related one of said plurality of coded output signals to an enabled other one of said programmable divider means and display.

8. A frequency synthesizer and control apparatus according to claim 7 wherein said display means comprises at least one seven segment visual display module driven by said stored signals of said controllable latch means.

9. Digital control apparatus according to claim 7 wherein said display means comprises at least two controllable latch means controlling separate visual display modules and wherein said control means includes control circuitry for alternately enabling each of said controllable latch means to enable said latch to respond to received digital control signals while the other controllable latch means is disabled and prevented for responding to those control signals, and wherein the same digital control signals are continuously simultaneously applied to both of said controllable latch means, and wherein said control circuitry includes an oscillator means for alternately enabling said controllable latch means.

10. A frequency synthesizer and control apparatus according to claim 8 wherein said pluralities of coded output signals supplied by said memory means to said programmable divider means, when said programmable divider means is enabled, are binary coded decimal signals, and wherein said pluralities of coded output signals supplied by said memory means to said display means, when said display means is enabled, are direct drive seven segment excitation signals for said seven segment display module.

11. A frequency synthesizer and control apparatus according to claim 7 wherein said control means disables said programmable divider means during the changing, by said manual tuning means, of the input signals received by said memory means.

12. Digital control apparatus comprising:
signal producing means for receiving control signals and producing different corresponding pluralities of digital coded output signals in response to said control signals;
programmable divider means coupled to said signal producing means for receiving said pluralities of coded output signals and producing, when enabled, different predetermined divisions in response to and related to each different received plurality of coded output signals, wherein said programmable divider means, when disabled, produces the predetermined division corresponding to the coded output signals received by said programmable divider means when said programmable divider means was last enabled;
display means coupled to said signal producing means for receiving said pluralities of coded output signals and producing, when enabled, different corresponding predetermined displays in response to and related to each different received plurality of coded output signals, wherein said display means comprises controllable latch means for receiving signals when enabled and storing those received signals when disabled while providing those stored signals as drive signals to display modules; and
control means coupled to said signal producing means, said programmable divider means, and said display means for alternately enabling each of said programmable divider and display means while the other means is disabled while also correspondingly alternately changing one of said pluralities of coded output signals from said signal producing means, wherein said control means utilizes the signal producing means to alternately produce different pluralities of output control signals to sequentially control both said programmable divider means and said display means to produce a display related to the division implemented by said programmable divider means, said control means utilizing said signal producing means to provide one of said pluralities of coded output signals to an enabled one of said programmable divider means and display means and then to provide a different but related one of said pluralities of coded output signals to an enabled other one of said and display means.

13. Digital control apparatus according to claim 12 wherein said one and said different but related one of said pluralities of coded output signals are both representative of a single numerical quantity, but are coded in two different code formats.

14. Digital control apparatus according to claim 13 wherein said two different formats correspond to binary coded decimal and direct drive seven segment code formats.

15. Digital control apparatus according to claims 12, 13, or 14 wherein said signal producing means provides a plurality of the coded output signals comprising said one and said different but related one of pluralities of coded output signals at a plurality of output terminals of said signal producing means which are coupled to both said programmable divider means and said display means.

16. A frequency synthesizer and control apparatus comprising:
signal producing means for receiving control signals and producing different corresponding pluralities of digital coded output signals in response to said control signals;
programmable divider means, included in a phase locked loop means and coupled to said signal producing means, for receiving pluralities of coded output signals and producing, when enabled, different predetermined frequency divisions in response to each different received plurality of coded output signals, wherein said programmable divider means, when disabled, produces the predetermined division corresponding to the coded output signals received by said programmable divider means when said programmable divider means was last enabled;
said phase locked loop means producing an output signal having a frequency determined by the frequency division of said programmable divider means;

display means coupled to said signal producing means for receiving said pluralities of coded output signals and producing, when enabled, different corresponding predetermined displays in response to and related to each different received plurality of coded output signals, wherein said display means comprises controllable latch means for receiving signals when enabled and storing those received signals when disabled and wherein said display means comprises at least one visual display module driven by said stored signals of said controllable latch means;

manual tuning means coupled to said signal producing means for adjustably producing some of said control signals supplied to said signal producing means; and control means coupled to said signal producing means, said manual tuning means, said display means and said programmable divider means for alternately enabling each of said programmable divider means and said display means while the other means is disabled while also correspondingly alternately changing one of said pluralities of coded output signals supplied by said signal producing means, wherein said control means utilizes the signal producing means to alternately produce different pluralities of output control signals to sequentially control both said divider means and said display means to produce a display related to the frequency division implemented by said programmable divider means, said control means utilizing said signal producing means to provide one of said pluralities of coded output signals to an enabled one of said divider programmable divider means and display means and then to provide a different but related one of said pluralities of coded output signals to an enabled other one of said programmable divider means and display means.

17. A frequency synthesizer and control apparatus according to claim 16 wherein said one and said different but related one of said pluralities of coded output signals are both representative of a single numerical quantity, but are coded in two different code formats.

18. A frequency synthesizer and control apparatus according to claim 17 wherein said two different formats correspond to binary coded decimal and direct drive seven segment code formats.

19. A frequency synthesizer and control apparatus according to claims 16, 17, or 18 wherein said signal producing means provides a plurality of the coded output signals comprising said one and said different but related one of pluralities of coded output signals at a plurality of output terminals of said signal producing means which are coupled to both said programmable divider means and said display means.

* * * * *